US005990776A

United States Patent [19]
Jitaru

[11] Patent Number: 5,990,776
[45] Date of Patent: *Nov. 23, 1999

[54] LOW NOISE FULL INTEGRATED MULTILAYERS MAGNETIC FOR POWER CONVERTERS

[76] Inventor: Ionel Jitaru, 2378 N. Sun Lake Pl., Tucson, Ariz. 85749

[ * ] Notice: This patent issued on a continued prosecution application filed under 37 CFR 1.53(d), and is subject to the twenty year patent term provisions of 35 U.S.C. 154(a)(2).

[21] Appl. No.: 08/351,943

[22] Filed: Dec. 8, 1994

[51] Int. Cl.$^6$ ......................................................... H01F 5/00
[52] U.S. Cl. ............................................. 336/200; 336/223
[58] Field of Search ..................... 336/200, 223, 336/232

[56] References Cited

U.S. PATENT DOCUMENTS

| | | | |
|---|---|---|---|
| 3,483,499 | 12/1969 | Lugten | 336/200 |
| 4,547,961 | 10/1985 | Bokil et al. | 29/602 R |
| 4,677,538 | 6/1987 | Brodzik et al. | 363/126 |
| 5,111,169 | 5/1992 | Ikeda | 333/181 |
| 5,166,965 | 11/1992 | Collier | 378/101 |
| 5,312,674 | 5/1994 | Haertling et al. | 428/210 |
| 5,319,342 | 6/1994 | Kuroki | 336/170 |
| 5,321,380 | 6/1994 | Godek et al. | 336/232 |
| 5,402,098 | 3/1995 | Ohta et al. | 336/200 |
| 5,420,558 | 5/1995 | Ito et al. | 336/200 |
| 5,463,365 | 10/1995 | Iwatani et al. | 336/98 |
| 5,552,756 | 9/1996 | Ushiro | 336/200 |

FOREIGN PATENT DOCUMENTS

| | | | |
|---|---|---|---|
| 5-152134 | 6/1993 | Japan | 336/200 |
| 6-163270 | 6/1994 | Japan | 336/200 |

*Primary Examiner*—Michael L. Gellner
*Assistant Examiner*—Anh Mai

[57] ABSTRACT

A multilayers structure in which all the magnetic elements have the windings edged in the inner layers and the magnetic core which surrounds the winding has the legs penetrating through the multilayers structure. The interconnection between the magnetic elements and the rest of electronic components are done through the layers of the multilayers board, horizontally and vertically through vias. For higher power components special cuts are performed in the multilayers board to accommodate the body of the components which may be connected to an external heatsink. The winding arrangement in the transformer is done in a such way to minimize and even eliminate the common mode noise injected through the capacitance between primary and secondary winding. The input filter is constructed to exhibit a differential and a common mode impedance. Supplementary capacitors are incorporated in the multilayers structure to offer a low impedance to the noise to short it to the source, or for injecting currents of opposite polarity to cancel the common mode current transferred through the transformer's inter winding capacitance and through the parasitic capacitance of the switching elements to the secondary. The insulation between winding can be in accordance with the safety agency requirements, allowing much shorter creapage distances inside of the multilayers PCB structure than in the air due to the compliance with coating environment.

16 Claims, 6 Drawing Sheets

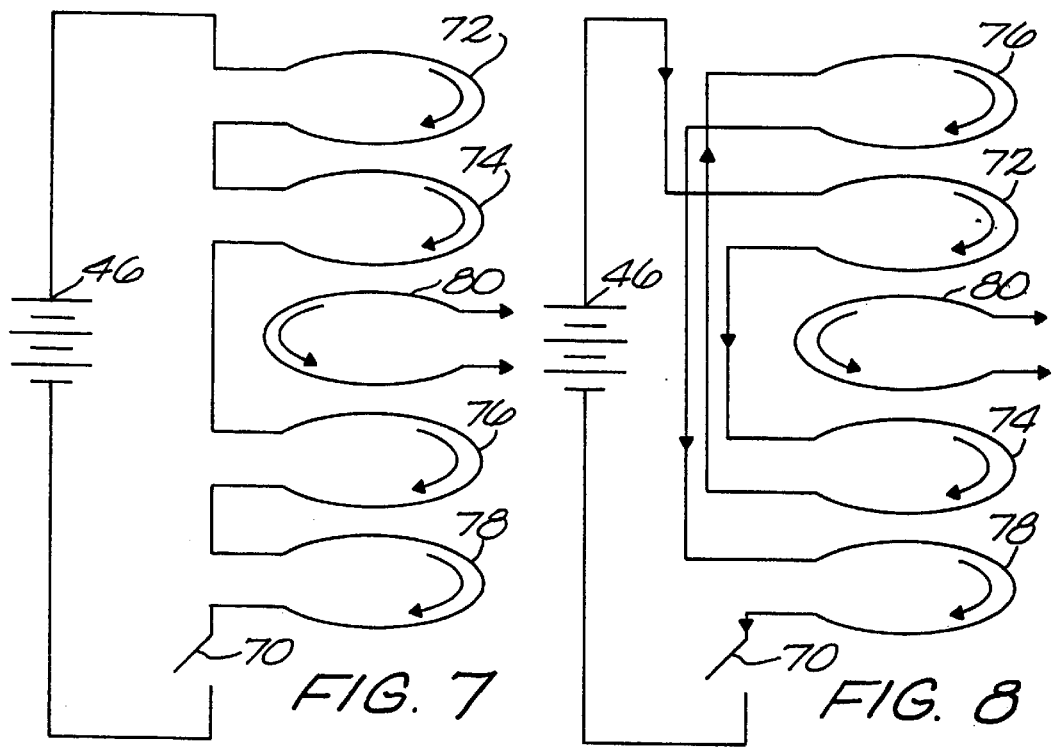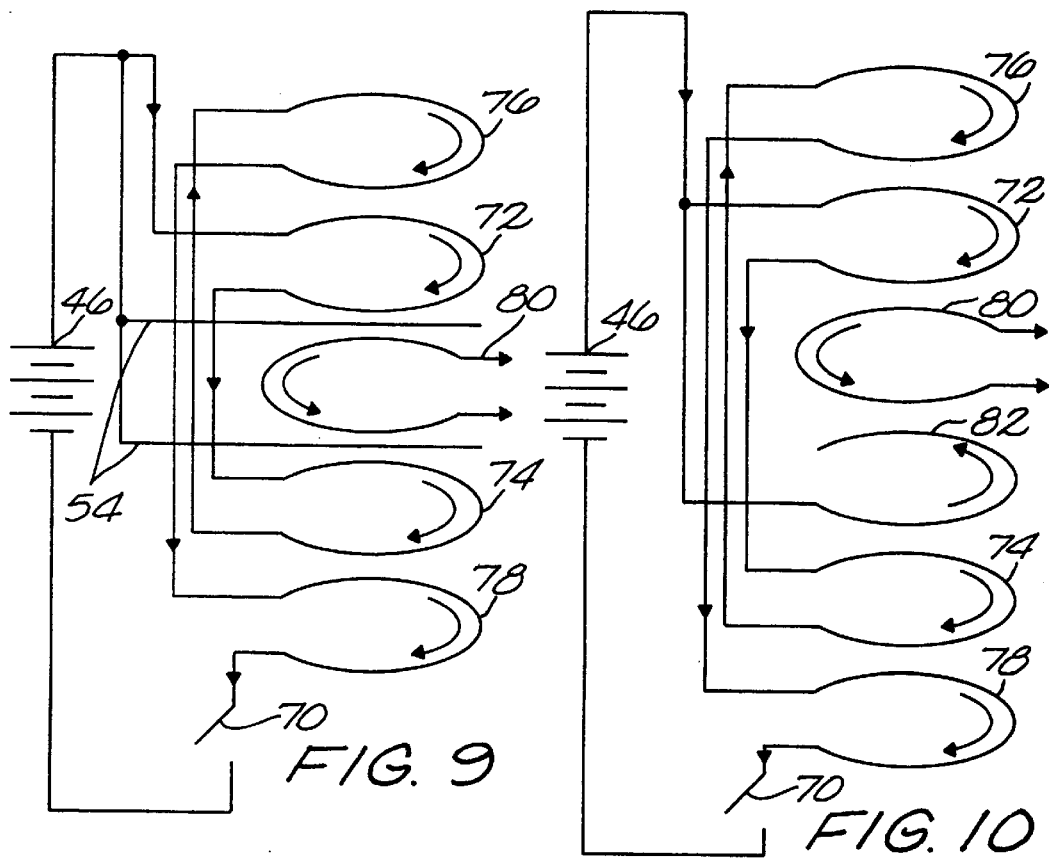

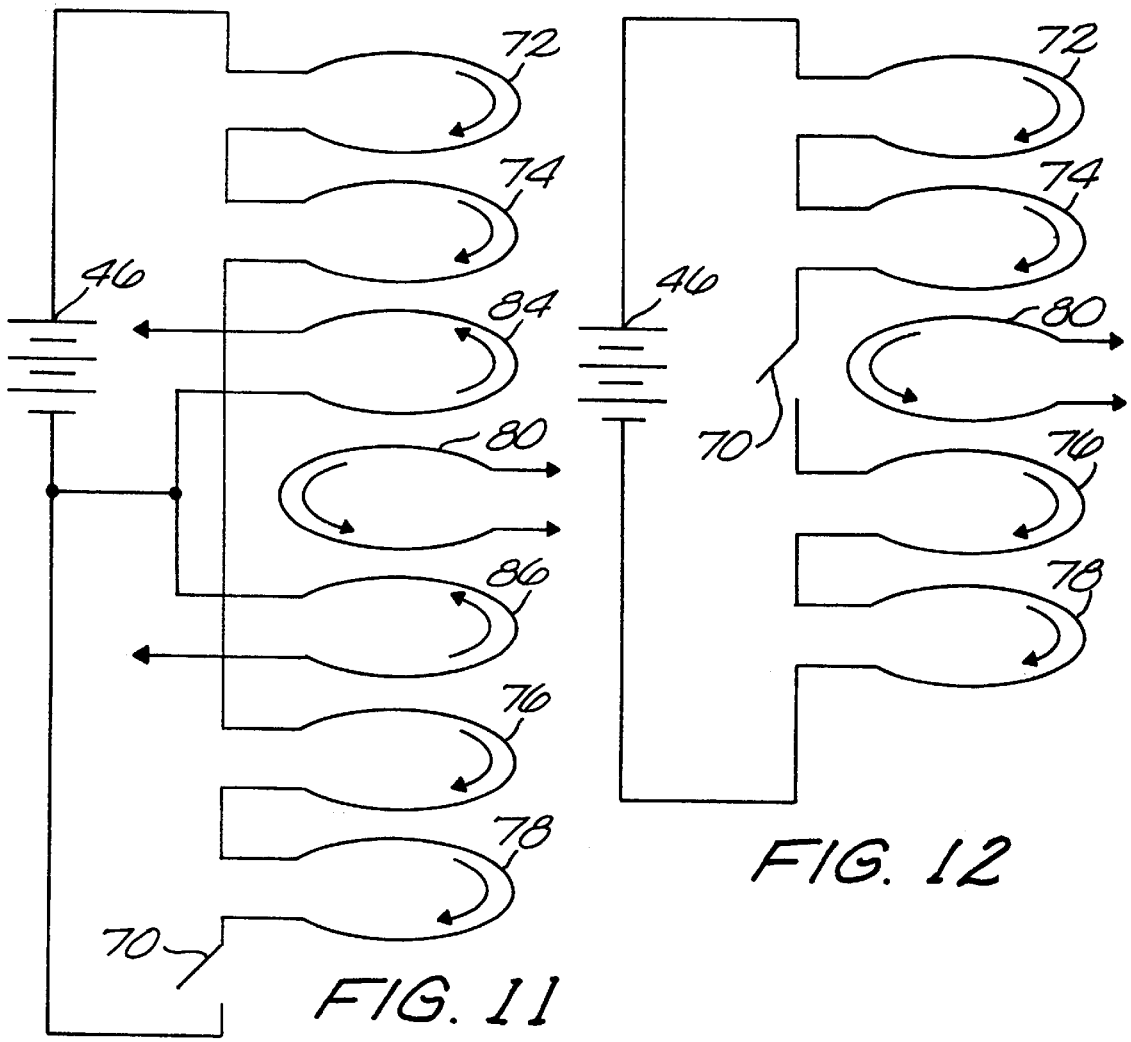
FIG. 11
FIG. 12
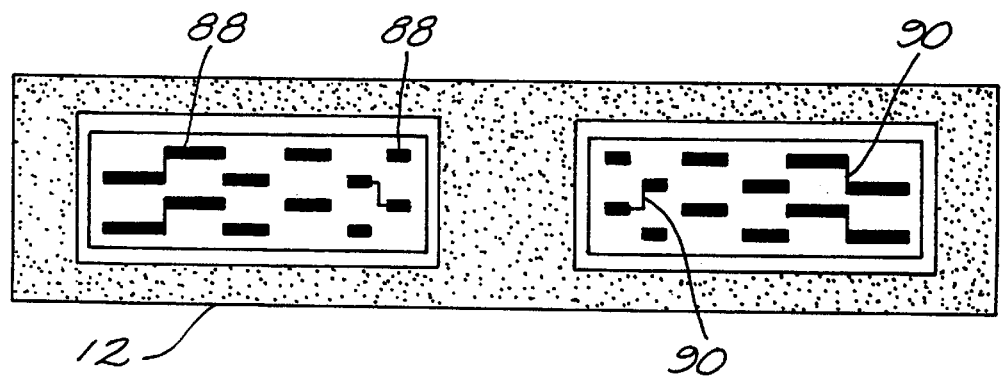
FIG. 13

LOW NOISE FULL INTEGRATED MULTILAYERS MAGNETIC FOR POWER CONVERTERS

BACKGROUND OF INVENTION

1. Field of the Invention

This invention relates to DC-to-DC converters, DC-to-AC, AC-to-AC inverters and AC-to-DC converters. The major characteristic of this power conversion technique is that all the magnetic elements are implemented on the same multilayers structure, and th e power transfer is made highly efficient and by minimizing the common mode noise.

2. Description of the Prior Art

There is a continuing industry demand for increasing power density, which means more power transferred in a given volume. A method for increasing the power transfer through the converter is to increase the switching frequency in order to minimize the size of magnetic and the capacitors. Using prior art topologies such as forward or flyback, which employ "hard" switching techniques, makes high frequency operation less efficient. The switching losses associated with switching elements, which turn on when there is a voltage across them, are proportional with the switching frequency. An increase in switching frequency, leads to an increase in switching losses and an increase in level of electromagnetic interference (EMI).

In order to overcome limitations in switching speeds, the prior art has devised a new family of resonant and quasi-resonant converters. In the case of quasi-resonant converters, the prior art technique consists of shaping the current or voltage to become half sinusoidal and to perform the switching when the current or voltage reaches zero. The reactive elements which contribute to shaping the current or voltage are part of the basic circuit and are considered undesirable in classic topologies. An example of one such circuit can be found in Vinciarelli, "Forward Converter Switching at Zero Current", U.S. Pat. No. 4,415,959. The technique utilized by Vinciarelli consists of adding a resonant capacitor across the fly wheeling diode to create a resonant circuit in combination with the leakage inductance of the transformer. During the ON time of the main switch, a current charges the resonant capacitor. When the current reaches zero, the main switch turns OFF in the primary of the transformer. The output inductor discharges the resonant capacitor, transferring the energy to the load. This topology eliminates part of switching losses which allows the converter to run at a high frequency. However, this topology exhibits several drawbacks which limit its utilization to power under 200 W.

Another family of quasi-resonant converters which switch at zero voltage is described by F. C. Lee in High Frequency Power Conversion International Proceedings (April 1987), Intertec Communications, Ventura, Calif. These prior art circuits operate similarly to those described above with the exception that the main switch turns ON and OFF at zero voltage. This has the advantage of eliminating the losses caused by the discharged of the capacitance of the switch at turn ON and also decreases the driving current utilized in the MOSFET switch due to the elimination of the Miller effect. However, the voltage across the main switch and the frequency modulation which is required for controlling the output power makes this topology unattractive.

New topologies structures which are refereed to as "Soft transitions Technologies" were developed, in order to eliminate the limitations associated with Quasi-resonant and resonant converters, but still maintaining the advantage of soft commutations for the switching elements. Such technologies are described by Mr. Jitaru in "Fixed Frequency Single Ended Forward Converter Switching at Zero Voltage" U.S. Pat. No. 5,126,931 and in "Square Wave Converter having an Improved Zero Voltage Switching Operation: U.S. Pat. No. 5,231,563. Using these topologies the converter operates at constant frequency, modulating the power by varying the duty cycle, the current and voltages on the switching elements are square-wave to decrease the current and voltages stress, the transitions are done at zero voltage conditions, and the power is transferred to the output, both during the ON time and OFF time.

These latest topologies have proven superior in respect of efficiency over the previous resonant and Quasi-resonant topologies. However, the parasitic elements of the circuit such as leakage inductance and stray inductance, will negatively affect the efficiency due the circulating energy contained in these parasitic elements. Due to the inter winding capacitance of the transformer the common mode noise will be injected into the secondary. In planar, low profile magnetic required for low profile packaging the inter-winding capacitance is larger, and as result the common mode noise injection via these parasitic capacitance is larger.

BRIEF SUMMARY OF THE INVENTION

The invention offers a construction technique of the main transformer which also extends to all the magnetic elements, wherein the parasitic elements of the circuit are minimized. In the same time the common mode current injected to the secondary via the inter winding capacitance is reduced and even eliminated. The construction technique claimed in this inventions offers a simple and low cost method in further suppressing the differential and common mode noise at the converter level. This novel construction technique offers an avenue in increasing the power density of the converter and allows full compliance with the safety agencies.

The planar multilayers magnetic is characterized by the use of flat copper spirals located on separate dielectric layers. Each layer can contain one turn or multiple spiral turns. The interconnection between the layers can be done by vias or an interconnecting heater. The insulator material can be laminated epoxy filled board, such as FR4 or different dialectic materials. The planar multilayers structure has been described by Mr. Alex Estrov in " Power Transformer Design for 1 Mhz Resonant Converter" at High Frequency Power Conversion in 1986. However, by decreasing the height of the planar magnetic the footprint will increase in order to maintain the same winding resistance. This will sacrifice the power density of the converter. In this invention the transformer winding is buried between minimum two layers of dielectric and the space in top of the winding can be populated with surface mounted components for a better volumetric efficiency. The invention claims several winding structures in a planar transformer, designed to minimize the common mode noise. The inventions further claims a full integrated multilayers structure in which all the magnetic elements are located on the same multilayers structure. The winding arrangements in the input and output inductor are also structured to minimize the common mode noise. It further utilizes the inter layers capacitance to create a low impedance for the common mode and differential mode noise, and to short it back to the source. To compensate for the common mode noise injected by the primary switching elements into the common baseplate to the secondary, the invention claims a noise cancellation technique by injected into the secondary a common mode current of the same amplitude but in opposite phase, through the common baseplate or through the multilayers structure. The invention claims a packaging configurations in which some the components of the converter are surface mounted, located on the same multilayers structure and for higher power applications cuts in the multilayers structure are performed to allow for the body of the power components. The heat-sink of the power components is connected to external heat-sinks.

BRIEF DESCRIPTION OF THE DRAWINGS

FIG. 7 presents a typical "sandwich" layer distribution in the transformer for a reduced leakage inductance and a reduced ac copper losses.

FIG. 8 depicts a layer distribution aimed to decrease the common mode current injection to the secondary, by locating the secondary layers in between "quiet" primary layers. Quiet primary windings are those which exhibit a lower amplitude voltage swing in report to the primary ground.

FIG. 9 presents a further common mode current reduction by using a shield between the secondary and two "quiet" primary layers.

FIG. 10 presents a method for the cancellation of the common mode current into the secondary by locating the secondary layers between the "quiet" layer connected to the input DC voltage source and a "Noise cancellation winding" which creates a negative imagine of the common mode current injected by first layer.

FIG. 11 depicts a configuration in which the secondary windings are located between two symmetrical auxiliary windings, which are wound in a such way to cancel the common mode current injected to the secondary via the primary to secondary winding capacitance.

FIG. 12 presents a configuration in which the switching element is connected in the middle of the primary winding, creating a perfect symmetry in which the common mode current injected into the secondary winding via the primary to secondary capacitance is canceled.

FIG. 13 depicts a winding arrangement in a magnetic element designed to reduce the inter-winding capacitance and for a better utilization of the copper. The width of each turn becomes larger as one moves from the inside turn to the outermost turn. In this way the winding resistance for the shorter turn can equal to the winding resistance for the longer turn. There is a shift between the layers to minimize the capacitance in between two adjacent layers.

DETAILED DESCRIPTION OF THE PREFERRED EMBODIMENTS

The multilayers planar magnetic, in which the windings are continuous flat copper spirals located on separate dielectric substrates, have been used before for signal and data processing. In power conversion filed the multilayers magnetic started to be used since 1986. However, there are several limitations with multilayers magnetic which prevented this technology from a large utilization. Decreasing the height of the magnetic, by utilizing flat winding leads to an increased footprint. As a result a large portion of the board on which the multilayers planar magnetic is mounted, cannot be used for another purpose, having a negative impact on the volumetric efficiency. Another limitation associated with planar multilayers magnetic is the increased inter winding capacitance, which leads to higher switching losses on the switching elements and a larger common mode current injected to secondary via the capacitance between primary and secondary winding. The parasitic elements such as the leakage inductance can be decreased in planar multilayers technology, but there is still the negative effect of parasitic elements associated with the interconnection pins. The interconnection pins will add to the cost of the magnetic and also will contribute an increase in losses.

Figure 1:
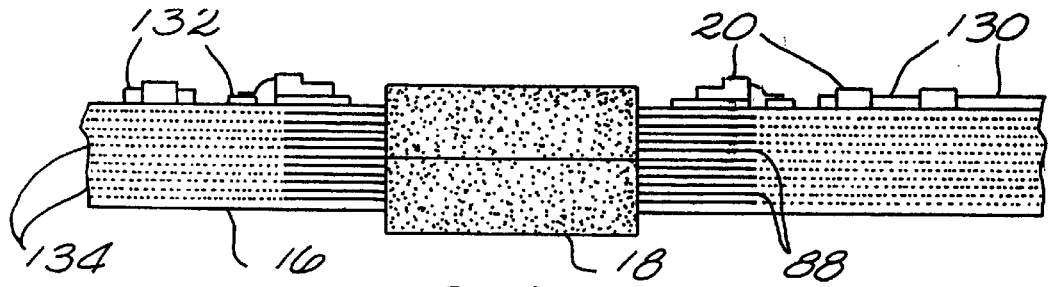
FIG. 1 is a cross-section view of the buried multilayers magnetic for a better volumetric efficiency.
Figure 2:
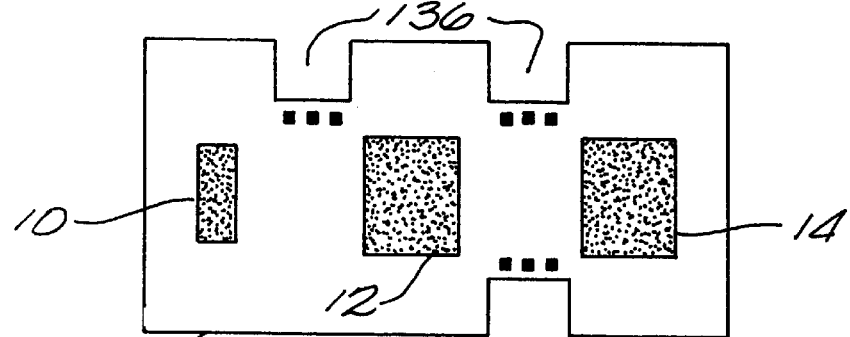
FIG. 2 is a top view if the assembled power converter using full integrated multilayers magnetic.

This invention offers a solution to the limitations associated with the prior art planar multilayers magnetic. Turn now to FIG. 1 wherein a methodology of the invention is illustrated. The planar windings of the magnetic 8 are incorporated in an multilayers PCB structure 16. The top and bottom layer of the multilayers board 16 are utilized for interconnection and for pads of the surface mounted components 20, or for shielding purposes or different other interconnections. By burying the magnetic winding inside of multilayers construction the footprint of the magnetic is reduced to the footprint of the core. This will allow a better utilization of the board, increasing also the power density. By burying the magnetic inside of a epoxy filled multilayers structure such as multilayers PCB, the creapage distances requirement in between the windings and the edge of the board or cuts will be decreased. This is due to the fact that the spacing between primary and secondary inside of multilayers PCB has to comply with the coating environment. These spacing are several times smaller than those in the air. Another advantage of this construction technique is the fact that the interconnection between the magnetic elements, for example between the transformer and output choke are done though the same multilayers PCB, eliminating the need for interconnection pins. The power components can be located in top of the multilayers PCB, interconnecting with the magnetic winding through vias, or can be located on an external heatsink, using cuts in the PCB tailored to the body of power components as is depicted in FIG. 2. In FIG. 2 is presented a full integrated multilayers PCB structure which incorporates all the magnetic elements such as the input filter 10, the main transformer 12, and the output choke 14. The body of the power components is accommodated by using cuts in the multilayers PCB structure. The connection of the power components to the windings is done by through holes in which the terminals of the components can be soldered to. For lower power levels the power components are located in top of the PCB and through vias or large parallel pads a low thermal impedance is created to the bottom of the multilayers PCB to which an external heatsink can be attached. The additional heatsink may not be required if there is an air flow in top of the converter.

The magnetic core 18, will have its legs penetrating through the multilayers PCB. The core will create a closed magnetic path with or without an air gap, function of the electrical topology which utilized.

Figure 3A:
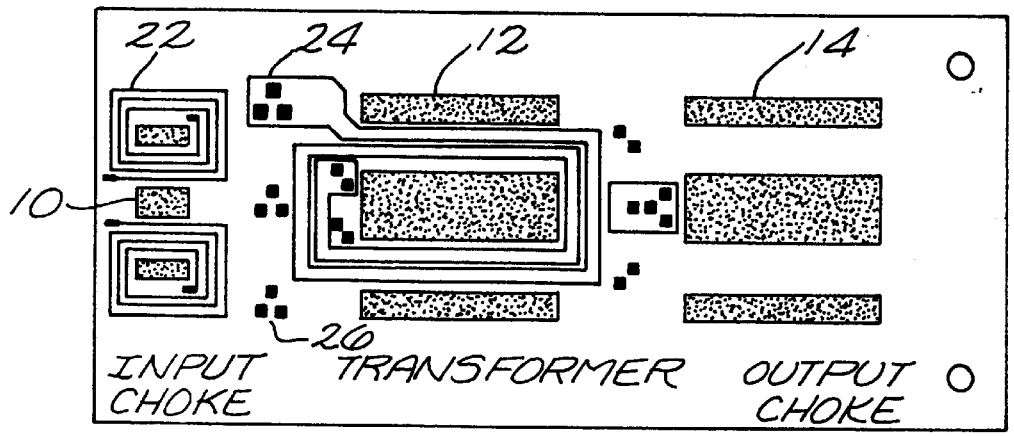
FIG. 3A is an inner layer in the full integrated multilayers magnetic which contains a section of the input filter winding and a section of the transformer's primary winding.

In FIG. 3A is presented the structure of a inner layer which contains a section of the input choke winding 22 and a section of the primary winding 24 of the transformer. The cores of the input choke 10, main transformer 12 and output choke 14, are penetrating through the multilayers PCB. The vias 26, are designed to interconnect the winding from different layers. Some of the vias are designed to interconnect the magnetic windings to the components located on top and bottom of the multilayers PCB.

Figure 3B:
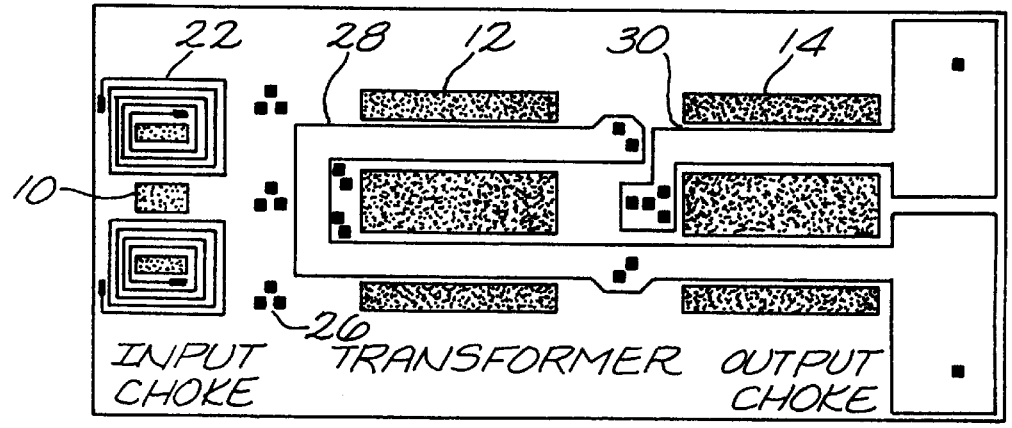
FIG. 3B is an inner layer in the full integrated multilayers magnetic which contains a section of the input filter winding, a section of the transformer's secondary winding and a section of the output inductor winding.

In FIG. 3B is presented the structure of a inner layer which contains a section of the input choke winding 22, a section of the secondary winding of the transformer 28 and a section of the winding of the output choke 30. The connection from the transformer to output choke is done directly without supplementary interconnections. This will minimize the stray inductance associated with the interconnection pins.

One of the novelty claimed by this invention is the integration of all the magnetic elements on the same multilayers structure and for a better utilization of the space, the magnetic windings are buried inside, allowing the top and bottom layer to be utilized for locating surface mounted components. This leads to a very efficient utilization of the volume due to a three dimensional utilization. This form of integration leads to a minimization of the interconnection impedance and as result leads to a higher efficiency in power processing.

Figure 14:
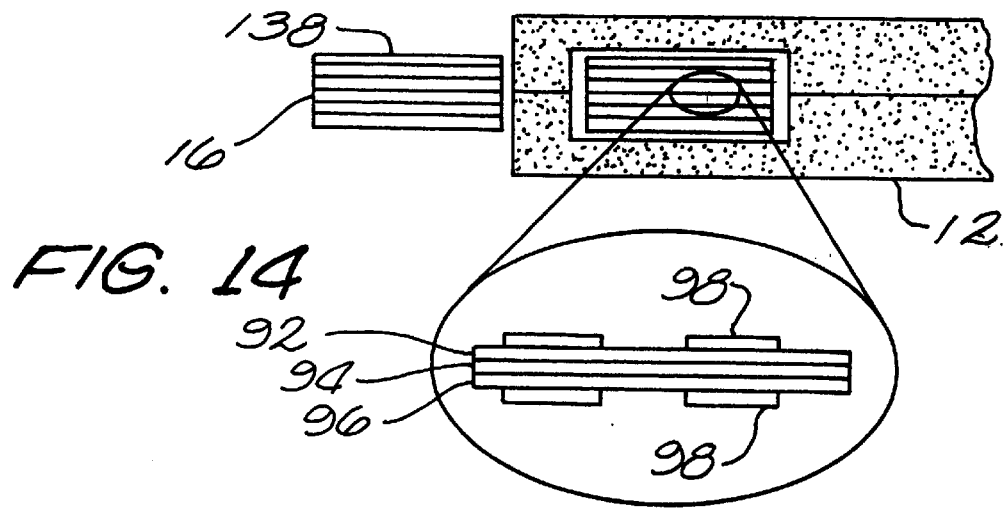
FIG. 14 presents a method of compliance with IEC950 in which three layers of core material are used, for example FR4, between the primary winding and secondary winding.
Figure 15:
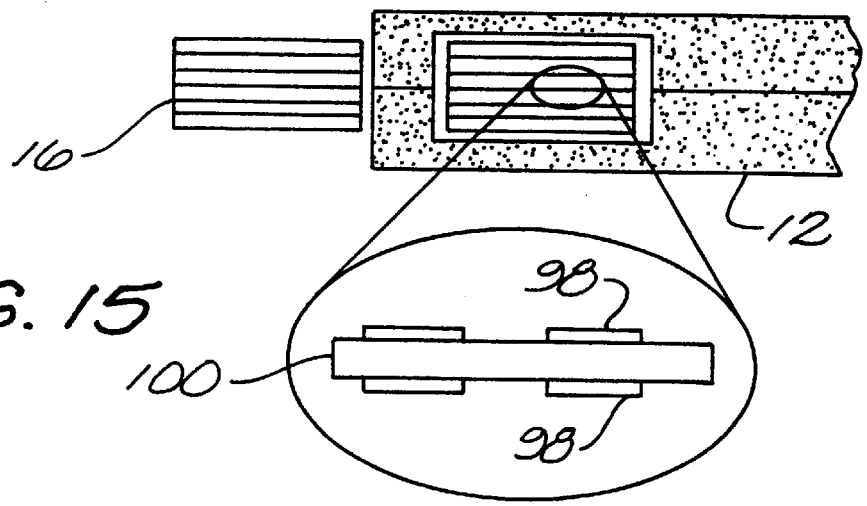
FIG. 15 presents a second method of compliance with IEC950 wherein the core material in between primary and secondary winding has to be thicker than 0.4 mm.
Figure 16:
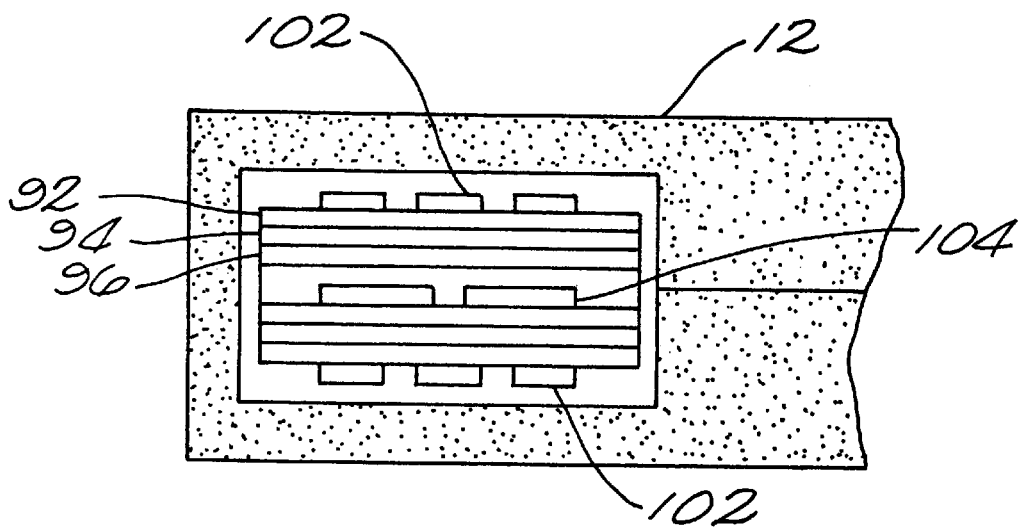
FIG. 16 depicts a method of compliance with safety agencies in which the magnetic core is reported to the primary and the transformer does not have to be buried. The secondary winding has to comply with the creapage distances in accordance with coating environment, based on the RMS voltages measured in the transformer.

The multilayers PCB magnetic offers a good avenue in addressing the creapages and clearances requirements demanded by the safety agencies. By burring the transformer inside of PCB as is depicted in FIG. 14, the spacing between primary and secondary is determined in accordance with the RMS voltages in transformer applied to a coating environment. These spacing are several times smaller than those in the air. However, between primary and secondary windings two or three layers of core material 92, 94, 96 is demanded, each two able to withstand the dielectric test. Another method requires the core material between the primary and secondary 98, to be at least 0.4 mm. The magnetic core can be reported to the primary or to the secondary. In FIG. 16 is presented a case in which the core is reported to the primary. The secondary winding 104 are buried inside and the distance from the secondary winding 104 to the edge of the core slot has to comply with the creapage requirements for the RMS voltage measured in the transformer. Using this method the primary winding 102 and the interconnecting vias do not have to be buried in the multilayers PCB.

Figure 4:
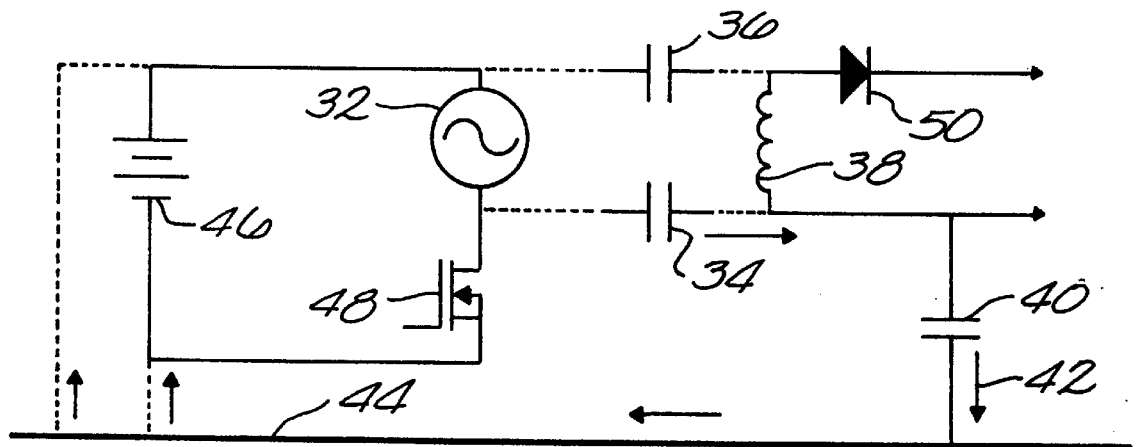
FIG. 4 depicts the injection of the common mode current through the primary to secondary winding capacitance, due to the voltage gradient across the primary winding of the transformer.

The AC voltage gradient across each turn of the winding is equal, but reported to the input ground the amplitude of the voltage swing increases from the turn connected to the input DC source to the maximum level to the turn connected to the switching element. As is depicted in FIG. 4 the voltage swing 32 across the primary winding, injects a current in the secondary winding 38 via the primary to secondary winding capacitance 34, 36. This current is further flowing through the decoupling capacitor 40, through the earth ground 44, returning through the connections of the input source 46. Again, common-mode noise is not differential with respect to the output. It does, however, flow in both input and output leads of the power supply and is a noise parameter that is measured by the FCC and VDE.

Figure 5:
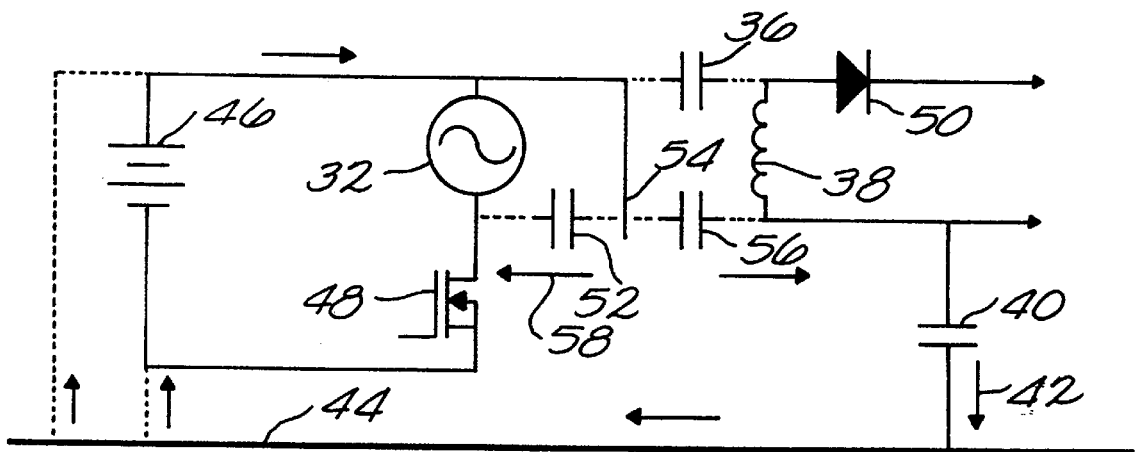
FIG. 5 presents the effect of a shield between primary and secondary winding in order to decrease the common mode current via the primary to secondary winding capacitance.

One method in suppressing some of the common mode noise is by utilizing a shield 54, or two located in between primary and secondary winding and connected to the input DC source or the input ground. This method is depicted in FIG. 5. The capacitance between the shield 54 and the primary winding creates a low impedance path for the common mode current created by the AC voltage across the primary winding 32. However the stray impedance of the shield itself will create a voltage gradient across it which will inject a common mode current via the capacitance 56 between the shield and the secondary winding 38. This common mode current 42, is reduced in comparison to the structure without the shield. However, the parasitic inductance of the connection to the input DC source 46, is critical for shielding effectiveness. One of the major drawback associated with the use of the shield is the fact that an increased parasitic capacitance will be created across the primary winding and across the secondary winding. This will increase the switching losses on the switching elements. This parasitic capacitance 52 will be in parallel with the inter winding capacitance of the primary and the parasitic capacitance of the switch itself. The switching losses will become more significant at higher operation frequency and for high input voltage applications such as Off-line converters.

In FIG. 7 is presented a winding arrangement in a converter in which the secondary windings 80 are sandwiched between the primary windings. For simplicity, I consider that the primary winding of the transformer is contained in four layers and the secondary winding in one layer. The winding of layer 1 connected to the input voltage source 72, exhibit a lower voltage swing reported to the input ground comparative to the winding 78 of layer 4 connected to the switching element 70. In this particular case the voltage swing reported to the primary ground is four times larger for layer 4, 78 than for the layer 1, 72. It is logical to locate the secondary 80 in the vicinity of the "quiet" primary such as 72. However the secondary has to be located symmetrically in between primary windings for two reasons. One reason is to minimize the magnetic field intensity in between winding for lower AC copper loss, and the second reason is to lower the leakage inductance between primary and secondary. In order to decrease the common mode current injection into the secondary via the capacitance between primary winding to secondary winding, and maintaining in the same time the sandwiched structure, the configuration of FIG. 8 is suggested. In FIG. 8 the secondary winding is located between two "quiet" layers. The voltage swing across layer 1 is much smaller than the voltage swing across layer 3. This structure does not eliminated the common mode injection to the secondary but it will reduce it. The advantage of this configuration is the fact that it does not require any additional layer. In FIG. 9 is presented a configuration in which two layers in top and bottom of the secondary are used as a shield. The location of the shield in vicinity of two "quiet" layers, layer 1, 72 and layer 2, 74 will not increase significantly the parasitic capacitance across the primary winding. However two layers of the multilayers structure will be allocated to the shield.

A configuration which can reduce the common mode noise injection to the secondary to zero is depicted in FIG. 10. In this configuration a noise cancellation winding 82, is added. The polarity of the voltage swing across this winding is in opposite to the polarity of the voltage swing across the winding in layer 1. As result the common mode current injected into the secondary winding will be canceled. This method will require only one additional layer and if a perfect geometrical symmetry can be accomplished, the common mode current injected in the secondary can be totally canceled. The single drawback of this method is the fact that one layer will be allocated just for the noise cancellation.

In FIG. 11 is presented a configuration in which two layers are added, one in top and one in the bottom of the secondary winding. This windings have a common symmetrical connection which is connected to the input ground. The connection can be also to the input DC voltage source. The voltage swing across the winding 1, 84 and auxiliary winding 2, 86 will inject a common mode current into the secondary, but of the opposite polarity of each other. As a result the total common mode current injected to the secondary will be zero. These auxiliary windings can be utilized to provide power in the primary section such as the necessary bias power, or can provide the power for a primary reported output.

Another path for the common mode current is through the capacitance between the switching elements in the primary and in the secondary, and the baseplate. This applies for higher power applications in which a common heatsink baseplate is used for the power components in primary and secondary. Due to a large voltage swing of the power switch tab, this source of common mode noise can be dominant. This invention claims a method for cancellation of the common mode current produced by the switching elements. This is done by creating a supplementary capacitor between secondary and the termination of the noise cancellation winding not connected to the input DC source or input ground. The noise cancellation windings are described in FIG. 10 and FIG. 11. By properly tailoring this additional capacitance a current will be injected into the secondary, of the same amplitude but in opposite phase to the current injected by the switching elements to the secondary via the capacitance between the switches and the baseplate. The additional capacitance between the noise cancellation winding and secondary can be implemented in the metal basepalte or in the multilayers structure.

Another method which does not require supplementary layers for output common mode noise cancellation is presented in FIG. 12. In this case the primary winding is symmetrically cut in a half and the power switch is connecting to these sections. The voltage swing on the layers which surrounds the secondary, layer 2, 74 and layer 3, 76, will have the same amplitude but will be of opposite polarity. As a result the common mode noise injected into the secondary will be zero.

Figure 6:
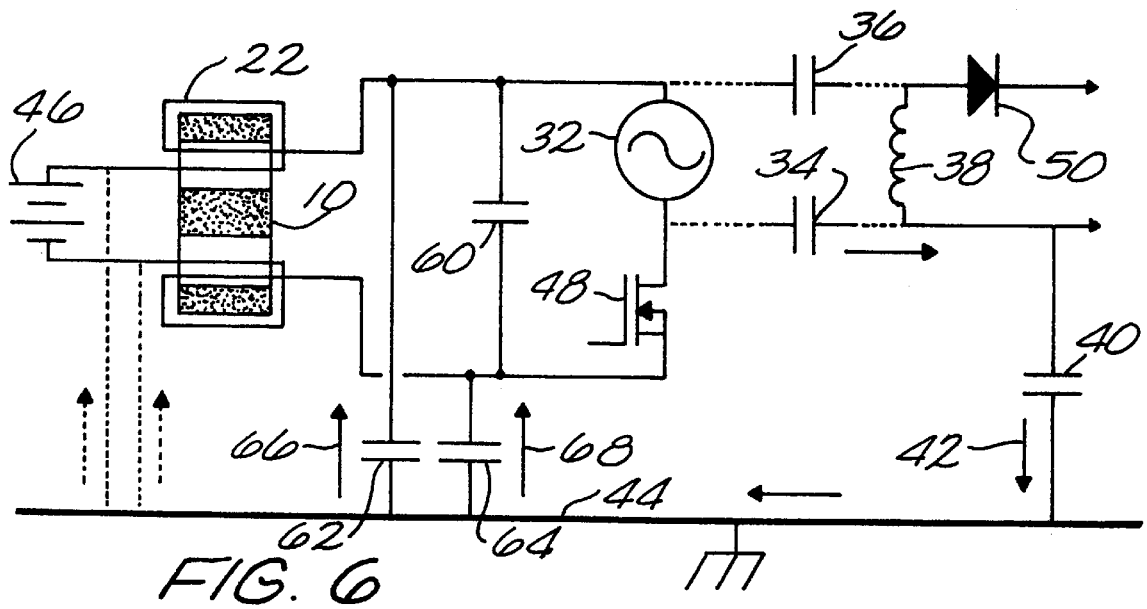
FIG. 6 presents the use of a differential mode and common mode input choke together with two "Y" capacitors in order to reduce the common mode current flowing towards the input source.

The structures presented above will reduce the common mode noise injection to the secondary via the inter winding capacitance of the transformer. However, if the common mode noise will be generated by different circuitry or if a further reduction of common mode is required, a supplementary common mode filter may be required. Such a structure is described in FIG. 6. By utilizing a EE or EI core gapped in the center leg, the input choke can exhibit a common mode and a differential mode impedance. By using the outer legs of the E core, two inductive elements can be implemented in the PCB. The coupling in between these inductors will determine the CM impedance, and it can be tailored by the gaping configuration of the core. For example, if there is not a gap in the core, the coupling coefficient is K=0.071. If there is 1 mill gap in all the legs, K=0.276. If only the center leg is gapped to 2 mil, K=0.724. The common mode and differential mode inductance can be tailored by properly gapping the core, and making sure that under all loading conditions the core does not saturate. Utilizing full integrated multilayers PCB, the cost of the input EMI filter is reduced to the cost of the magnetic core. The capacitors 62, and 64 are used to create a low impedance for the common mode current which will work against the high impedance exhibited by the input filter. The capacitors 62 and 64 can be created in the structure of the multilayers PCB, which will lead to a cost reduction of the converter and to a better utilization of the multilayers structure. These capacitors can be constructed to comply with the safety agencies by using the recommendations suggested for the transformer compliance with safety agencies, previously discussed.

In FIG. 13 is presented a method for reduction of the parasitic capacitance across the magnetic winding. This is accomplished by shifting the adjacent layers. For a better utilization of the copper, the turn width will vary in a such way to ensure an equal resistance per each turn. The turn width is made larger as one moves from the inside turn to the outermost turn.

Figure 17:
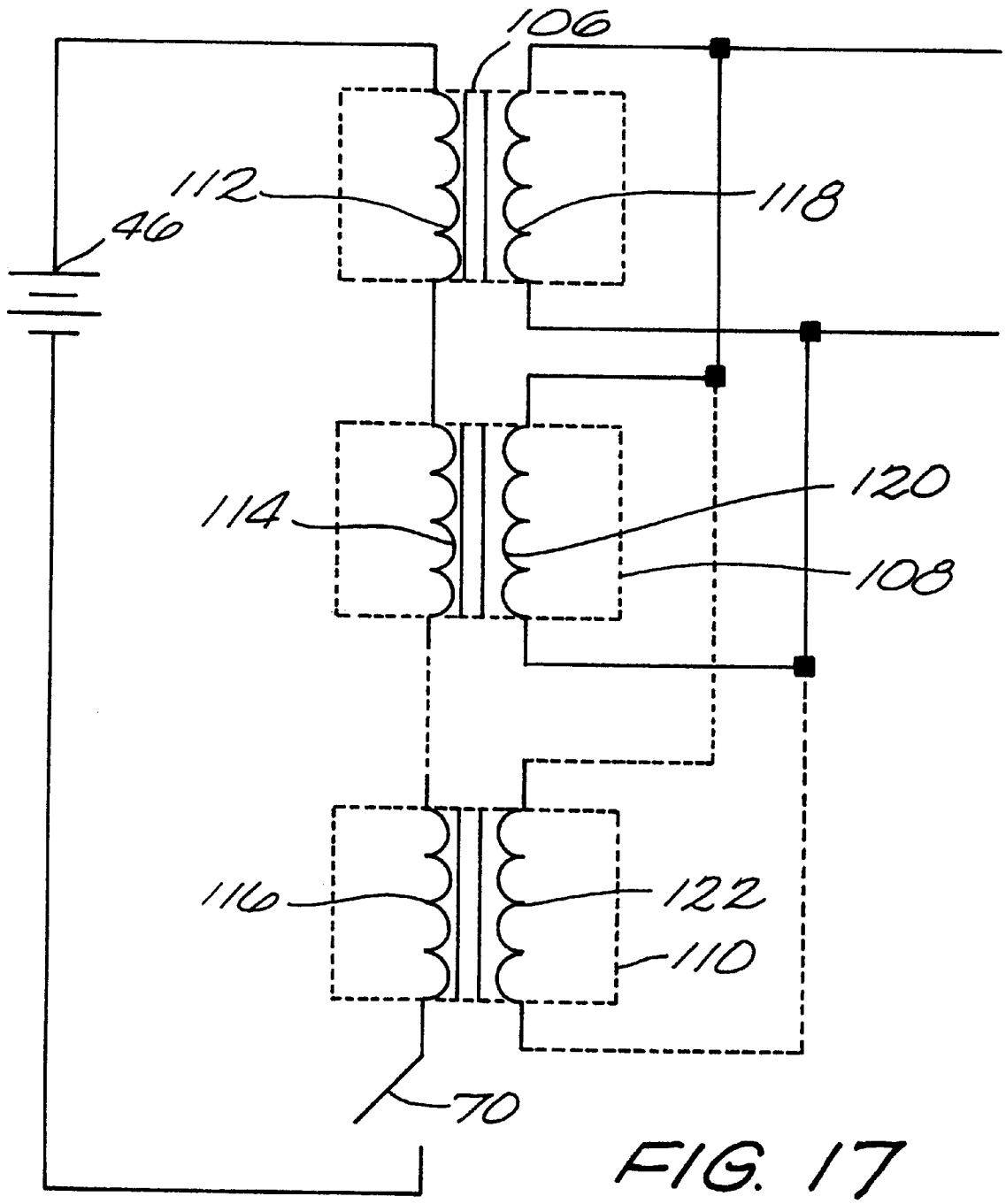
FIG. 17 presents a configuration in which multiple multilayers transformers on the same multilayers structure are utilized for higher power applications or for a reduced number of layers.

For higher power applications or in applications which require large currents multiple planar multilayers transformer can be utilized on the same multilayers structure as is depicted in FIG. 17. The number of layers in primary 112, 114, 116 and in the secondary 118, 120, 122 of these transformers 106, 120, 122, can be reduced to one, which will allow the use of two layer multilayers structure. Another advantage of this configuration is the fact that the leakage inductance in each transformer can be very low, which will make this configuration ideal for high current and low output voltage.

Many alternations and modifications may be made by those having ordinary skill in the art without departing from the spirit and scope of the invention. Therefore, the invention must be understood as being set forth above only for the purpose of example and not by way of limitation. The invention is defined by the following claims wherein means may be substituted therein for obtaining substantially the same result even when not obtained by performing substantially the same function in substantially the same way.

I claim:

1. A power processing device comprising:
   a) a multilayer printed circuit board having multiple layers of dielectric sheets;
   b) a first transformer core extending through said layers of dielectric sheets;
   c) a first set of electrically conductive buried windings, each of said buried windings encircling said first transformer core, and, each of said buried windings contained between two adjoining layers of said dielectric sheets; and, d) at least one power component secured to a first surface of said multilayer printed circuit board at a position over said first set of buried windings.

2. The power processing device according to claim 1, wherein all of said buried windings are electrically connected to each other.

3. The power processing device according to claim 2, further including electrically conductive traces deposited on said first surface of said multilayer printed circuit board and adapted to communicate electrical signals to said at least one surface mounted component.

4. The power processing device according to claim 1, wherein said first set of buried windings are each encapsulated in epoxy.

5. The power processing device according to claim 1, further including:
   a) a second transformer core extending through said layers of dielectric sheets; and,
   b) a second set of electrically conductive buried windings, each of said second set of buried windings encircling said second transformer core, and, each of said second set of buried windings contained between two adjoining layers of said dielectric sheets, and further, said second set of buried windings electrically connected to the first set of buried windings.

6. The power processing device according to claim 1, further including a second transformer core extending through said layers of dielectric sheets, said second transformer core being encircled by said first set of buried windings.

7. An electrical device comprising:
   a) a multilayer printed circuit board;
   b) a first transformer core extending through said multilayer printed circuit board; and,
   c) at least two electrically conductive winding, each electrically conductive winding encircling said first transformer core and contained between two adjoining layers of said multilayer printed circuit board; and
   d) at least one power component secured to a first surface of said multilayer printed circuit board at a position over said at least two electrically conductive windings.

8. The electrical device according to claim 7, wherein all of said electrically conductive windings are electrically connected to each other.

9. The electrical device according to claim 8, further including a set of electrically conductive traces deposited on said first surface of said multilayer printed circuit board and adapted to communicate electrical signals to said at least one surface mounted component.

10. The electrical device according to claim 7, wherein said at least two electrically conductive windings are each encapsulated in epoxy.

11. The electrical device according to claim 7, further including:
   a) a second transformer core extending through said multilayer printed circuit board; and,
   b) a set of electrically conductive windings contained within the layers of said multilayer printed circuit board, said set of electrically conductive windings encircling said second transformer core and electrically connect to the set of electrically conductive windings.

12. The electrical device according to claim 7, further including a second transformer core extending through said multilayer printed circuit board, and at least two electrically conductive windings encircling said second transformer and contained between layers of said multilayer printed circuit board.

13. An electronic system comprising:
   a) a multilayer printed circuit board having a first and a second surface;
   b) a transformer having,
      1) a transformer core extending through said multilayer printed circuit board, and,
      2) a series of electrically conductive windings, each of said windings contained between two adjoining layers of said multilayer printed circuit board and encircling said transformer core;
   c) a first surface mounted component secured to the first surface of said multilayer printed circuit board at a position over said windings; and,
   d) a first set of electrically conductive traces deposited on said first surface of said multilayer printed circuit board to communicate electrical signals to said first surface mounted component.

14. The electronic system according to claim 13, further including:
   a) a second surface mounted component secured to the second surface of said multilayer printed circuit board at a position over said windings; and,
   b) a second set of electrically conductive traces deposited on said second surface of said multilayer printed circuit board to communicate electrical signals to said second surface mounted component.

15. The electronic system according to claim 14, wherein all of said windings are electrically connected to each other.

16. The electronic system according to claim 15, wherein said windings are each encapsulated in epoxy.

* * * * *